United States Patent
Pettit

(10) Patent No.: US 7,161,228 B1
(45) Date of Patent: Jan. 9, 2007

(54) THREE-DIMENSIONAL INTEGRATED CAPACITANCE STRUCTURE

(75) Inventor: Ricky L. Pettit, Austin, TX (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/321,554

(22) Filed: Dec. 28, 2005

(51) Int. Cl.
*H01L 29/00* (2006.01)

(52) U.S. Cl. .................. 257/532; 257/499; 257/528; 257/E29.001

(58) Field of Classification Search .............. None
See application file for complete search history.

(56) References Cited

U.S. PATENT DOCUMENTS

| | | | |
|---|---|---|---|
| 5,208,725 A | 5/1993 | Akcasu | 361/313 |
| 5,978,206 A | 11/1999 | Nishimura et al. | 361/303 |
| 6,178,083 B1 | 1/2001 | Appeltans et al. | 361/306.1 |
| 6,963,122 B1* | 11/2005 | Soenen et al. | 257/532 |

* cited by examiner

*Primary Examiner*—Nathan J. Flynn
*Assistant Examiner*—Kevin Quinto
(74) *Attorney, Agent, or Firm*—Koppel, Patrick & Heybl

(57) ABSTRACT

A three-dimensional integrated capacitance structure comprises at least two arrays of "unit cells" on respective layers of an IC, with each unit cell comprising a center conductor and a conducting ring which surrounds the center conductor. Each array comprises a plurality of unit cells, tiled on a given IC layer at a predetermined pitch. The arrays are arranged vertically such that adjacent vertical arrays are offset in the x and y dimensions by a predetermined fraction—preferably ½—of the unit cells' pitch. The structure includes vias arranged to interconnect the arrays such that each center conductor is connected to a conducting ring of the array immediately above and/or below the center conductor, and such that each conducting ring is connected to a center conductor of the array immediately above and/or below the conducting ring.

13 Claims, 2 Drawing Sheets

SECTION C - C

THREE-DIMENSIONAL INTEGRATED CAPACITANCE STRUCTURE

BACKGROUND OF THE INVENTION

1. Field of the Invention

This invention relates to the field of integrated capacitors.

2. Description of the Related Art

Integrated circuits (ICs), particularly those which implement analog circuitry, often have a need for a capacitance element. Such capacitances provide many different circuit functions, such as filtering and compensation.

Traditional analog IC processes construct capacitors by sandwiching a dielectric layer between conductors. For example, a polysilicon layer deposited over a silicon substrate can serve as a capacitor's plates, with an oxide layer between the plates serving as a dielectric layer. Oxide layers are very thin, and hence this type of structure has a very high specific capacitance. Unfortunately, the polysilicon layers and terminals deposited thereon form a MOS structure. This leads to a highly non-linear capacitor unless a large DC bias is maintained across the capacitor. Such biases are incompatible with the low power supply voltages used with modern circuits. Further, MOS capacitors are polarized, and therefore cannot be used in circuits such as switched-capacitor circuits in which the terminals of the capacitor are flipped in polarity.

Capacitors may also be constructed using an IC's metal interconnect layers, with a dielectric layer between the metal layers to form a metal—metal capacitor. While such capacitors avoid the problems discussed above with respect to MOS capacitors, metal—metal capacitors have two drawbacks of their own. The interlayer dielectrics are relatively thick; hence, metal—metal capacitors have relatively low specific capacitances. Second, such capacitors suffer from parasitic, or "back-plate" capacitance between one, or both, of the terminals and the substrate of the IC. In most processes, the dielectric thickness between the interconnect layers is roughly equal to the dielectric thickness between the substrate and the bottom interconnect layer. Hence, the parasitic capacitance is roughly equal to the active capacitance.

IC processes having three metal interconnect layers have become common. In such processes, a stacked plate structure can be used to provide an improved capacitor structure over the metal—metal structure described above. In this case, the capacitor has two dielectric layers sandwiched between the three metal layers. The outer metal layers are electrically connected to form one terminal of the capacitor, while the middle layer forms the other terminal. This doubles the specific capacitance while leaving the parasitic capacitance approximately the same. Hence, such structures have roughly a 2:1 active to parasitic capacitance ratio.

Other stacked plate approaches are described, for example, in U.S. Pat. No. 5,208,725 to Akcasu, U.S. Pat. No. 5,978,206 to Nishimura et al., and U.S. Pat. No. 6,178,083 to Appeltans et al. Each of these devices relies on structures of parallel or orthogonal conductors which contribute to the device's total capacitance. However, special processing steps are typically required to implement these devices.

SUMMARY OF THE INVENTION

A three-dimensional integrated capacitance structure is presented which overcomes the problems noted above, providing relatively high capacitance density without requiring any special processing steps.

The present integrated capacitance structure comprises at least two arrays of "unit cells" on respective layers of an IC, with each unit cell comprising a center conductor and a conducting ring which surrounds the center conductor. Both center conductor and conducting ring are fabricated on the same layer of the IC. Each array comprises a plurality of unit cells, tiled on a given IC layer at a predetermined pitch.

The arrays are arranged vertically such that adjacent vertical arrays are offset in the x and y dimensions by a predetermined fraction—preferably ½—of the unit cells' pitch. The structure includes vias arranged to interconnect the arrays such that each center conductor is connected to a conducting ring of the array immediately above and/or below the center conductor, and such that each conducting ring is connected to a center conductor of the array immediately above and/or below the conducting ring.

Each center conductor preferably has the shape of a square plate, with each of the conducting rings preferably being a square-shaped ring which surrounds the center conductor. The center conductor and conducting ring preferably have approximately equal thicknesses.

The proximity of the unit cells is such that three-dimensional capacitive coupling is achieved between the unit cells. The capacitance structure's total capacitance includes a component due to lateral coupling between the center conductors and their surrounding conductive rings, a component due to the vertical overlap of the unit cells, and a component due to fringe coupling between adjacent layers.

The present capacitance structure can be implemented with a standard CMOS fabrication process, with no special processing steps required. The resulting structure provides a linear integrated capacitor suitable for many applications.

Further features and advantages of the invention will be apparent to those skilled in the art from the following detailed description, taken together with the accompanying drawings.

DETAILED DESCRIPTION OF THE INVENTION

The present invention is a three-dimensional integrated capacitance structure which provides a relatively high capacitance density, and can be fabricated using standard process sequences. The structure is particular suitable for use on ICs fabricated with processes having no specialized capacitor structure.

Figure 1A:
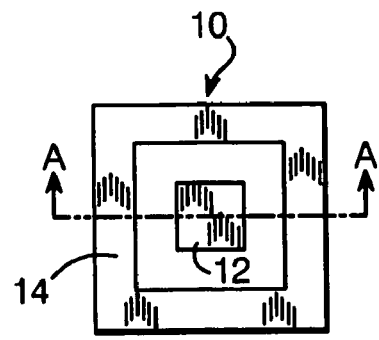
FIG. 1a is a plan view of a unit cell per the present invention.
Figure 1B:
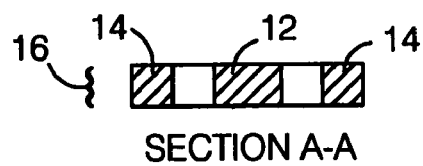
FIG. 1b is a cross-sectional view of the unit cell of FIG. 1a, cut along section line A—A.

The capacitance structure is created with layers of arrayed unit cells. A plan view of a typical unit cell is shown in FIG. 1a, with a corresponding cross-sectional view cut along section line A—A shown in FIG. 1b. Each unit cell 10 comprises a center conductor 12, and a conducting ring 14 which surrounds the center conductor. The capacitance structure is formed as part of an IC; center conductor 12 and conducting ring 14 are fabricated on the same layer 16 of the IC.

Figure 2A:
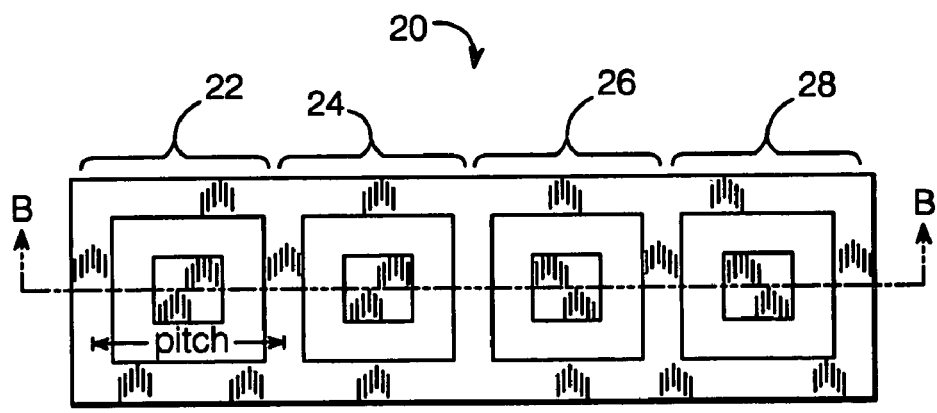
FIG. 2a is a plan view of an array of unit cells per the present invention.
Figure 2B:
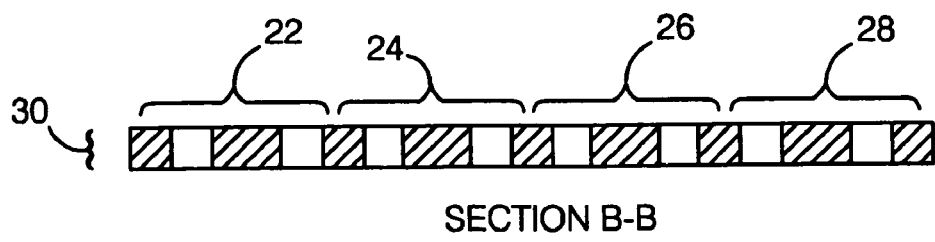
FIG. 2b is a cross-sectional view of the array of FIG. 2a, cut along section line B—B.

Unit cells are assembled into an array, which comprises a plurality of unit cells tiled on a given IC layer at a predetermined pitch. A plan view of such an array 20 is shown in FIG. 2a, with a corresponding cross-sectional view cut along section line B—B shown in FIG. 2b. In this example, array 20 comprises four unit cells 22, 24, 26, 28, which are tiled adjacent to each other on the same IC layer 30. Adjacent unit cells are spaced at a predetermined "pitch", defined as the distance between a reference point on one unit cell to the same reference point on an adjacent cell.

Figure 3A:
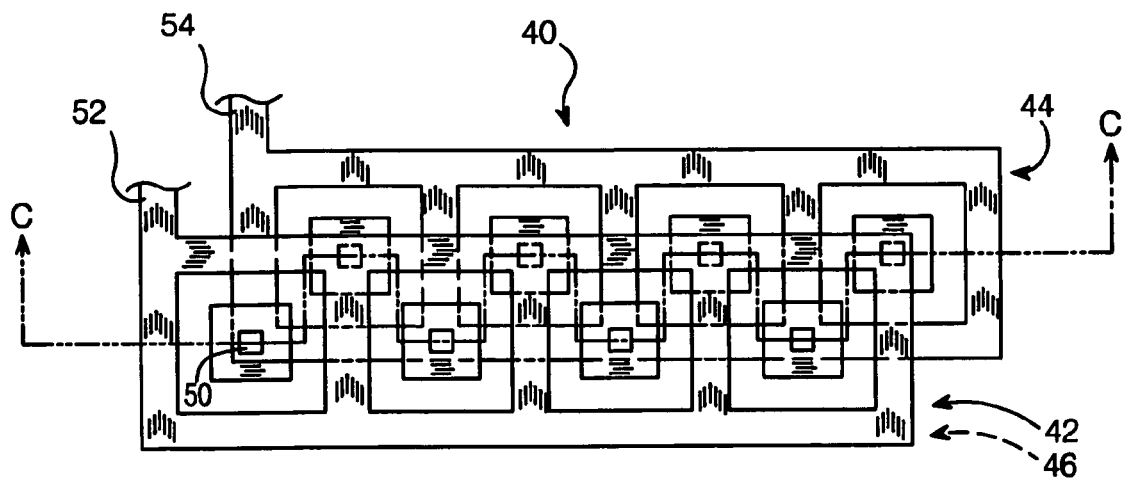
FIG. 3a is a plan view of a integrated capacitance structure per the present invention.
Figure 3B:
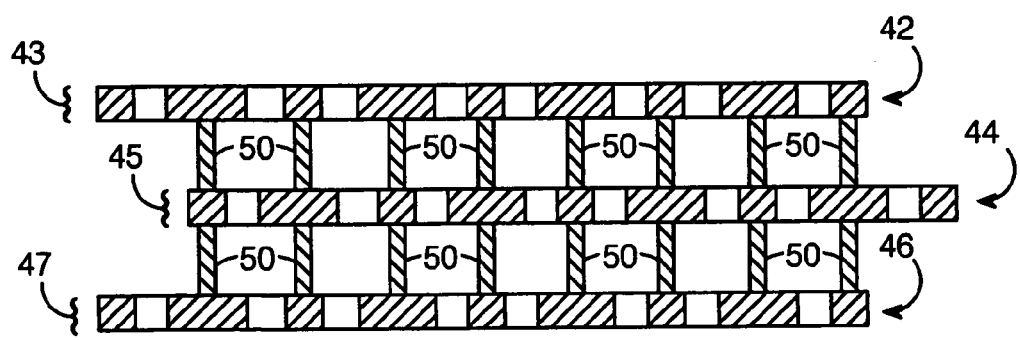
FIG. 3b is a cross-sectional view of the structure of FIG. 3a, cut along section line C—C.

To create the capacitance structure of the present invention, multiple unit cell arrays are stacked vertically, such that adjacent vertical arrays are offset in the x and y dimensions by a predetermined fraction of the unit cells' pitch. A plan view of such a structure 40 is shown in FIG. 3a, with a corresponding cross-sectional view cut along section line C—C shown in FIG. 3b. The present invention may include two or more arrays; in this example, three arrays of four units cells each are shown. Note that, for a practical device, each array would typically contain more than four unit cells.

A first array 42 resides on a first layer 43, a second array 44 resides on a second layer 45 below the first layer, and a third array 46 resides on a third layer 47 below the second layer. As noted above, adjacent vertical arrays 42, 44 and 46 are offset in the x and y dimensions by a predetermined fraction of the unit cells' pitch. In this example, the center conductors of each unit cell are square-shaped plates, and each of the conducting rings is also square-shaped; it is preferred that the thicknesses of the center conductors and their corresponding conducting rings be approximately equal. For this square conductor/square ring configuration, the preferred fraction is ½. Thus, if the unit cells' pitch is 10 μm, array 44 is offset from array 42 5 μm in the x direction, and 5 μm in the y direction, and array 46 is offset from array 44 by 5 μm in both x and y directions. When so arranged, the center conductor of each unit cell of array 42 is directly above the conducting ring of a unit cell of array 44, and the center conductor of each unit cell of array 44 is directly below the conducting ring of a unit cell of array 42. Similarly, the center conductor of each unit cell of array 46 is directly below the conducting ring of a unit cell of array 44, and the center conductor of each unit cell of array 44 is directly above the conducting ring of a unit cell of array 46.

The three arrays are interconnected using vias 50 such that, in general, each center conductor is connected to a conducting ring of the array immediately above and/or below the center conductor, and such that each conducting ring is connected to a center conductor of the array immediately above and/or below the conducting ring. Connections to the structure are effected by providing one terminal (52) that connects an array's conducting ring, and one terminal (54) that connects to the array's center conductor.

It is not essential that the unit cells' center conductors be square shaped, or that the conducting rings be square-shaped rings. Other shapes could also be used, as long as the cells can be arrayed in the x, y and z directions such that the center conductors and conducting rings can be in close proximity and interconnected as needed to provide a structure with a relatively high capacitance. Square conductors and rings tiled with an offset of ½ the pitch are preferred, as this provides the most efficient structure. A less efficient structure could be built using, for example, rectangular center conductors and conducting rings. However, different x-y pitches would be needed to provide proper connectivity.

The unit cell arrays would be fabricated on respective layers of the IC. Typically, the IC's conductive layers would be used, typically with dielectric layers located between each adjacent pair of unit cell arrays. The structure should be fabricated such that the proximity of the unit cells is such that three-dimensional capacitive coupling is achieved between the unit cells. When so arranged, the structure's total capacitance will include a component due to lateral coupling between the center conductors and their surrounding conductive rings, a component due to the vertical overlap of the unit cells, and a component due to fringe coupling between adjacent layers.

One advantage of the present capacitance structure is that it can be implemented with a standard CMOS fabrication process, without any special processing steps.

IC fabrication processes generally have a corresponding set of design rules, one of which specifies the smallest area of a single instance of metal that can be fabricated—referred to herein as the "minimum metal area". The surface area of the unit cells' center conductors preferably corresponds to the minimum metal area of the fabrication process used to implement the structure. The center conductors could be larger than the specified minimum, but this would provide less capacitance per unit area. However, for some applications, it may be necessary to design the unit cells with center conductors larger than the minimum metal area, for better manufacturing yields or to interface to a different metal layer which has a larger minimum metal area design rule.

The present structure can be used as a general purpose capacitor, and can be used wherever a linear integrated capacitor is needed. For example, a capacitance structure per the present invention could be suitably employed as a compensation capacitor, which typically requires a high capacitance to provide the circuitry stability for which it is intended. Since no special process steps are required, the invention is particularly useful with processes for which no specialized layer capacitors are available.

The capacitance of the present structure can typically be estimated using a modeling program. More accurate values would be obtained from the characterization of actual capacitor structures fabricated as described herein.

While particular embodiments of the invention have been shown and described, numerous variations and alternate embodiments will occur to those skilled in the art. Accordingly, it is intended that the invention be limited only in terms of the appended claims.

I claim:

1. An integrated capacitance structure for use in an integrated circuit (IC), comprising:
   at least two arrays of unit cells on respective layers of said IC, each unit cell comprising:
   a center conductor; and
   a conducting ring which surrounds said center conductor, said center conductor and said conducting ring fabricated on the same layer of said IC;
   each of said arrays comprising a plurality of said unit cells tiled on a given one of said layers at a predetermined pitch;
   said arrays arranged vertically such that adjacent vertical arrays are offset in the x and y dimensions by a predetermined fraction of the pitch of said unit cells; and
   vias arranged to interconnect said arrays such that each center conductor is connected to a conducting ring of the array immediately above and/or below said center conductor, and such that each conducting ring is connected to a center conductor of the array immediately above and/or below said conducting ring.

2. The capacitance structure of claim 1, wherein said predetermined fraction is ½.

3. The capacitance structure of claim 1, wherein each of said center conductors is a square-shaped plate and each of said conducting rings is a square-shaped ring having a thickness approximately equal to that of the center conductor at its center.

4. The capacitance structure of claim 1, wherein each of said center conductors is a rectangle-shaped plate and each of said conducting rings is a rectangle-shaped ring having a thickness approximately equal to that of the center conductor at its center.

5. The capacitance structure of claim 1, wherein said arrays are fabricated on respective conductive layers of said IC.

6. The capacitance structure of claim 1, wherein the proximity of said unit cells is such that three-dimensional capacitive coupling is achieved between said unit cells.

7. The capacitance structure of claim 1, wherein the proximity of said unit cells is such that said structure's total capacitance includes a component due to lateral coupling between said center conductors and their surrounding conductive rings, a component due to the vertical overlap of said unit cells, and a component due to fringe coupling between adjacent layers.

8. The capacitance structure of claim 1, wherein said IC and capacitance structure are implemented with a standard CMOS fabrication process.

9. The capacitance structure of claim 1, wherein said IC and said capacitance structure are implemented with a fabrication process having an associated minimum metal area, the surface area of each of said center conductors being approximately equal to that of said minimum metal area.

10. The capacitance structure of claim 1, wherein said capacitance structure provides a linear integrated capacitor.

11. The capacitance structure of claim 1, wherein said capacitance structure provides a compensation capacitor.

12. The capacitance structure of claim 1, wherein said capacitance structure consists of three of said arrays on respective layers of said IC.

13. The capacitance structure of claim 1, further comprising dielectric layers disposed between adjacent pairs of said arrays.

* * * * *